US011159893B1

(12) United States Patent
Kervran (10) Patent No.: US 11,159,893 B1
(45) Date of Patent: Oct. 26, 2021

(54) MEMS SOUND TRANSDUCER (71) Applicant: AAC Acoustic Technologies (Shenzhen) Co., Ltd., Shenzhen (CN)

(72) Inventor: Yannick Kervran, Hk (FR)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/934,015

(22) Filed: Jul. 21, 2020

(51) Int. Cl.
*B81B 3/00* (2006.01)
*H04R 19/04* (2006.01)
*H04R 19/00* (2006.01)
*H02N 1/00* (2006.01)

(52) U.S. Cl.
CPC .......... *H04R 19/005* (2013.01); *B81B 3/0021* (2013.01); *H02N 1/008* (2013.01); *B81B 2201/033* (2013.01); *H04R 19/04* (2013.01); *H04R 2201/003* (2013.01)

(58) Field of Classification Search
CPC ........... H04R 19/005; H04R 2201/003; H04R 19/04; H02N 1/008; B81B 3/0021; B81B 2201/033
See application file for complete search history.

(56) References Cited

U.S. PATENT DOCUMENTS

| 6,074,890 | A  | * | 6/2000 | Yao ...................... | B81C 1/00484 438/24 |
| 8,966,990 | B2 | * | 3/2015 | Clark .................... | G01P 15/125 73/724 |
| 9,306,475 | B1 | * | 4/2016 | Ba-Tis .................... | H02N 1/008 |
| 9,695,038 | B2 | * | 7/2017 | Cargill ................... | H04R 19/04 |
| 9,938,133 | B2 | * | 4/2018 | Kautzsch .............. | B81B 3/0021 |
| 10,746,982 | B2 | * | 8/2020 | Vigna .................... | H02N 1/002 |
| 2004/0099739 | A1 | * | 5/2004 | Kuo ...................... | G02B 26/101 235/454 |
| 2012/0027235 | A1 | * | 2/2012 | Chan .................... | H04R 19/005 381/174 |
| 2014/0270271 | A1 | * | 9/2014 | Dehe ...................... | H04R 31/00 381/174 |

(Continued)

FOREIGN PATENT DOCUMENTS

| CN | 104458072 A1 | 3/2015 |
| CN | 207908539 A1 | 9/2018 |

OTHER PUBLICATIONS

PCT search report dated Apr. 20, 2021 by SIPO in related PCT Patent Application No. PCT/CN2020/125733 (4 Pages).

*Primary Examiner* — Oyesola C Ojo
(74) *Attorney, Agent, or Firm* — W&G Law Group (57) ABSTRACT

The present invention discloses a MEMS sound transducer. The sound transducer includes: a substrate having a back cavity; a stator, the stator having a central portion suspending on the back cavity and at least two fixed arms extending from the center portion to the substrate and fixed on the substrate; a movable cantilever, mounted to the substrate, at least partially facing the back cavity and disposed between two adjacent fixed arms; wherein, the movable cantilever has a fixed end mounted to the substrate and a free edge facing the fixed arms with space; the free edge has a plurality of moving comb-fingers formed thereon; the stator has a plurality of fixed comb-fingers formed on the fixed arms; the moving comb-fingers and the fixed comb-fingers fit to each other to form a capacitor with an overlap area.

9 Claims, 12 Drawing Sheets

(56) References Cited

U.S. PATENT DOCUMENTS

| | | | |
|---|---|---|---|
| 2016/0377649 A1* | 12/2016 | Rytkonen | G01P 15/18 73/514.32 |
| 2018/0029878 A1* | 2/2018 | Dehe | B81B 3/0021 |
| 2021/0051415 A1* | 2/2021 | Duan | B81B 3/0051 |

* cited by examiner

MEMS SOUND TRANSDUCER

FIELD OF THE PRESENT DISCLOSURE

The present invention relates generally to microphones. More particularly, this invention relates to a microelectromechanical (MEMS) sound transducer.

DESCRIPTION OF RELATED ART

In the prior art, it has been disclosed a system and method for a comb-drive MEMS device. The comb-drive MEMS device has one cantilever vibrating upward and downward actuated by a sound pressure waves, and a stator. The cantilever has rotor comb-fingers connected to the edge thereof and fixed comb-fingers connected to the stator. However, there are only one cantilever and stator formed in the MEMS device, which produces a low sensitivity device.

Therefore, it is necessary to provide a new sound transducer for solving above mentioned problem.

SUMMARY

In one aspect, a MEMS sound transducer, comprises: a substrate having a back cavity; a stator, the stator having a central portion suspended on the back cavity and at least two fixed arms extending from the center portion to the substrate and fixed on the substrate; a cantilever mounted to the substrate, at least partially facing the back cavity and disposed between two adjacent fixed arms; wherein, the cantilever has a fixed end mounted to the substrate and a free edge facing the fixed arms with space; the free edge having a plurality of moving comb-fingers formed thereon; the stator has a plurality of fixed comb-fingers formed on the fixed arms; the moving comb-fingers and the fixed comb-fingers fit to each other to form a capacitor with an overlap area.

DETAILED DESCRIPTION OF THE EXEMPLARY EMBODIMENTS

Hereinafter, the present disclosure will be further described with reference to the accompanying drawings and embodiments.

Embodiment 1

As shown in FIG. 1A through FIG. 4, a MEMS sound transducer 100 in the present invention includes a substrate 11 having a back cavity 110, a movable cantilever 121 and a stator 13 mounted on the substrate 11 and at least partially facing the back cavity 110. The stator 13 has a central portion 130 suspending on the back cavity 110 and at least two fixed arms 132 extending from the center portion 130 to the substrate 11 and fixed on the substrate 11. The movable cantilever 121 is disposed between two adjacent fixed arms 132 with space. The movable cantilever 121 having a fixed end 1210 fixed to the substrate 11 and a free edge 1211 facing the fixed arms 132 with space. A surface of the fixed arm 132 is fit to an adjacent surface of the free edge 1211 and facing each other to form a capacitor with an overlap area 10. In the embodiment, the surface of the stator 13 has a plurality of fixed comb-fingers 131 formed on the fixed arms 1321, and the adjacent surface of the free edge 1211 also has a plurality of moving comb-fingers 1213. The fixed comb-fingers 131 and the moving comb-fingers 1213 fit to each other to form a capacitor with an overlap area 10. Preferably, a height of the movable cantilever 121 in a vibrating direction L is equal to the height of the fixed arm 132 in the vibrating direction L. In other embodiments, the height of the movable cantilever 121 in the vibrating direction L may be different from that of the fixed arm 132 in the vibrating direction L.

Figure 1A:
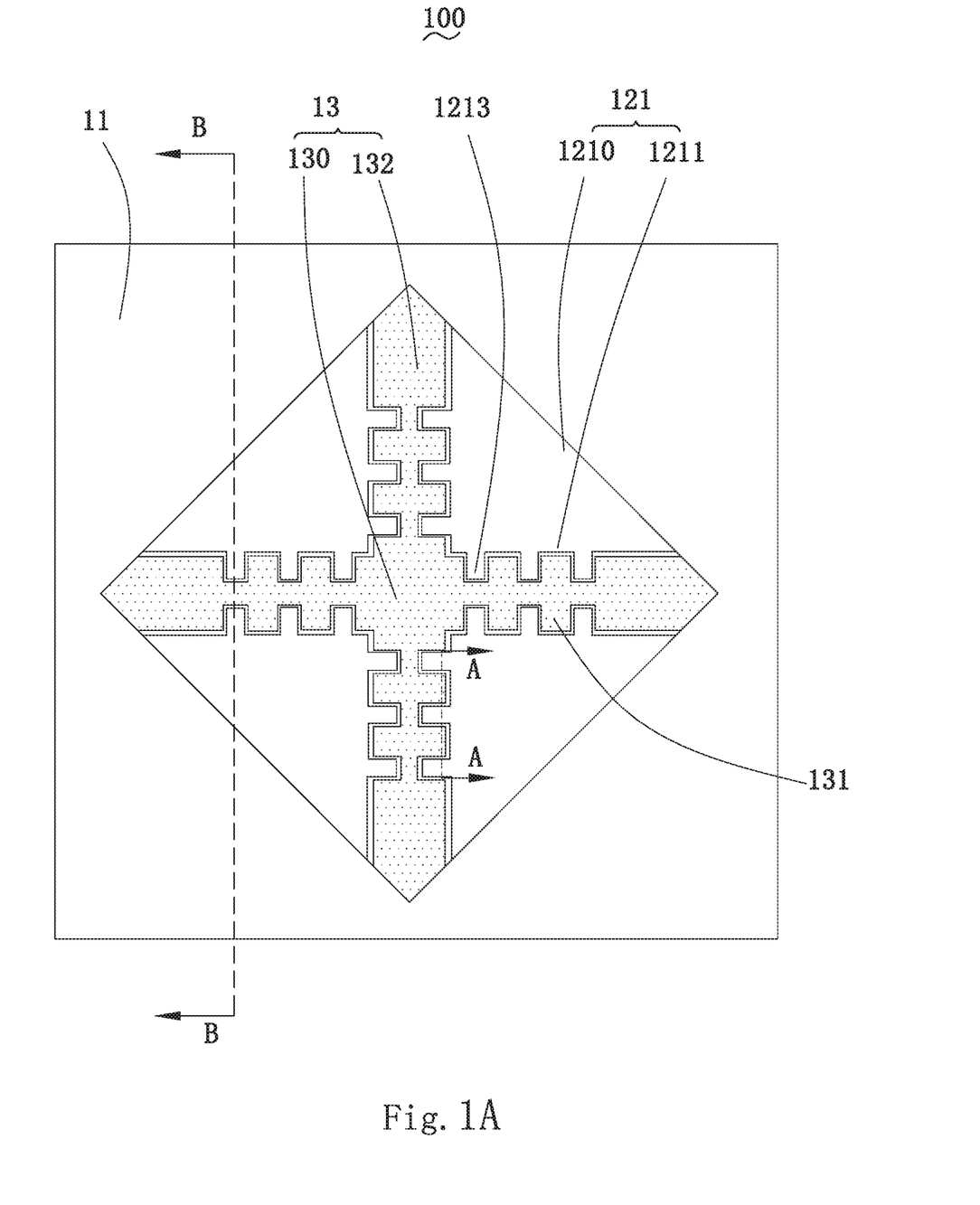
FIG. 1A through 1C are schematically top views of a MEMS sound transducer according to a first embodiment of the present invention.
Figure 1B:
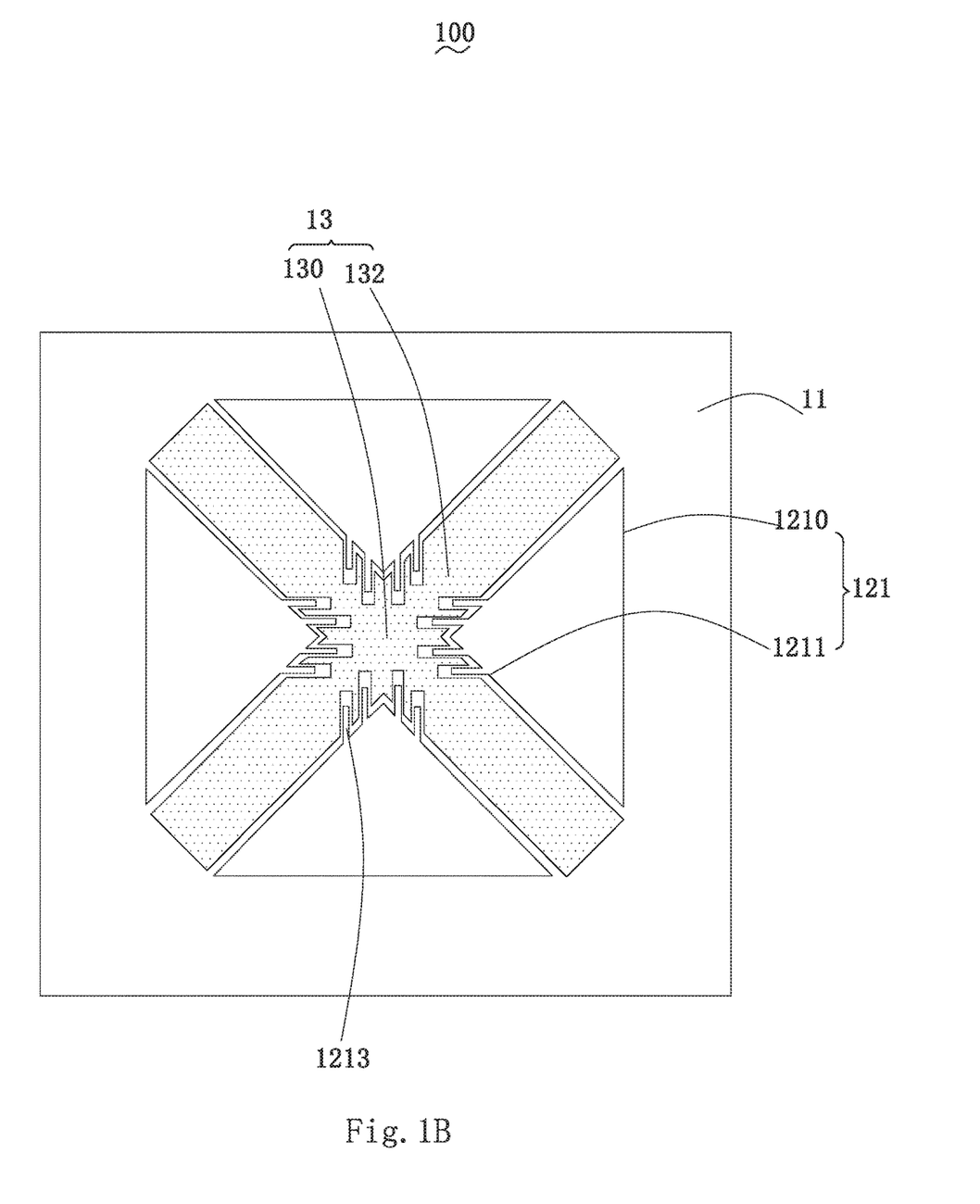
Figure 1C:
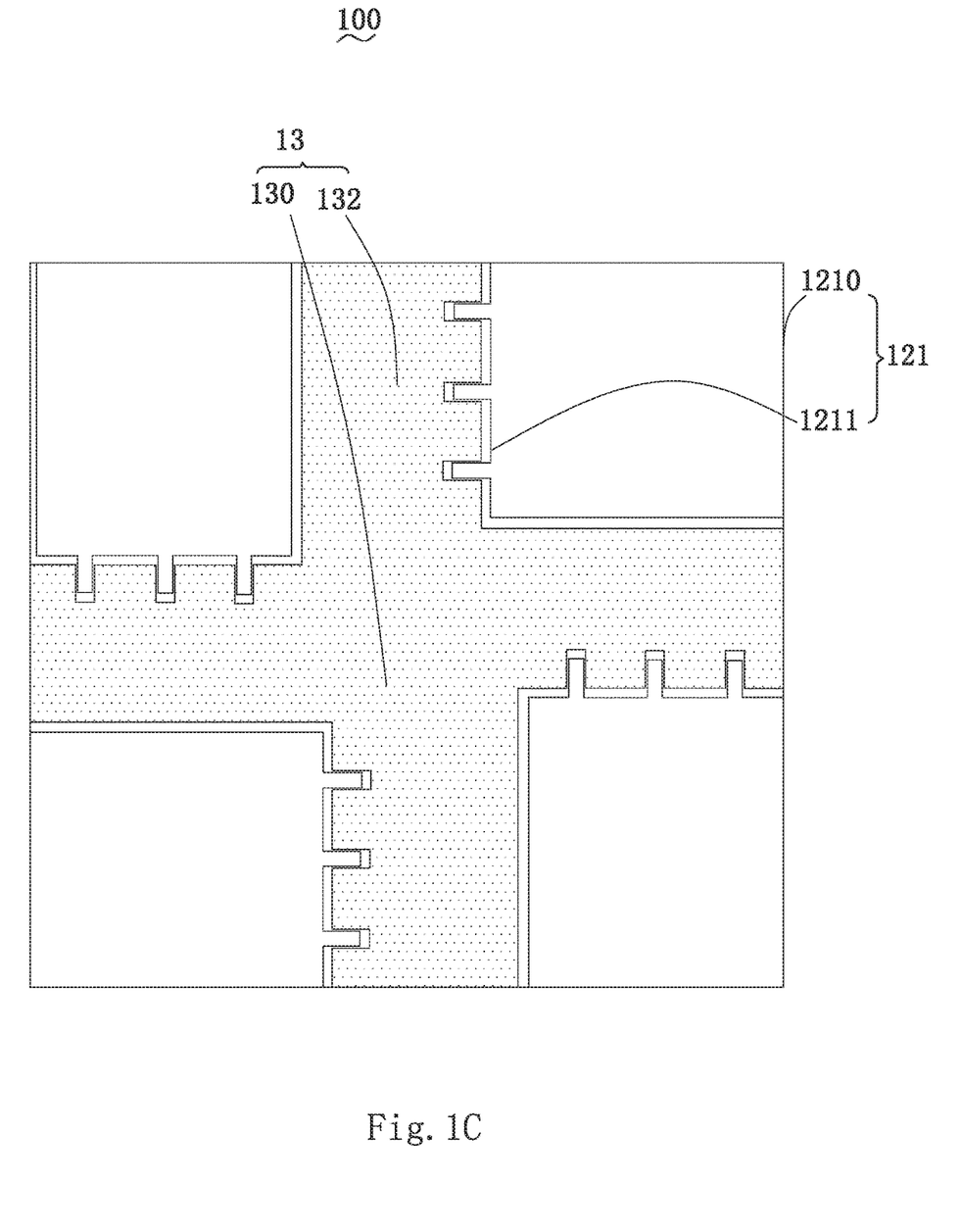
Figure 2:
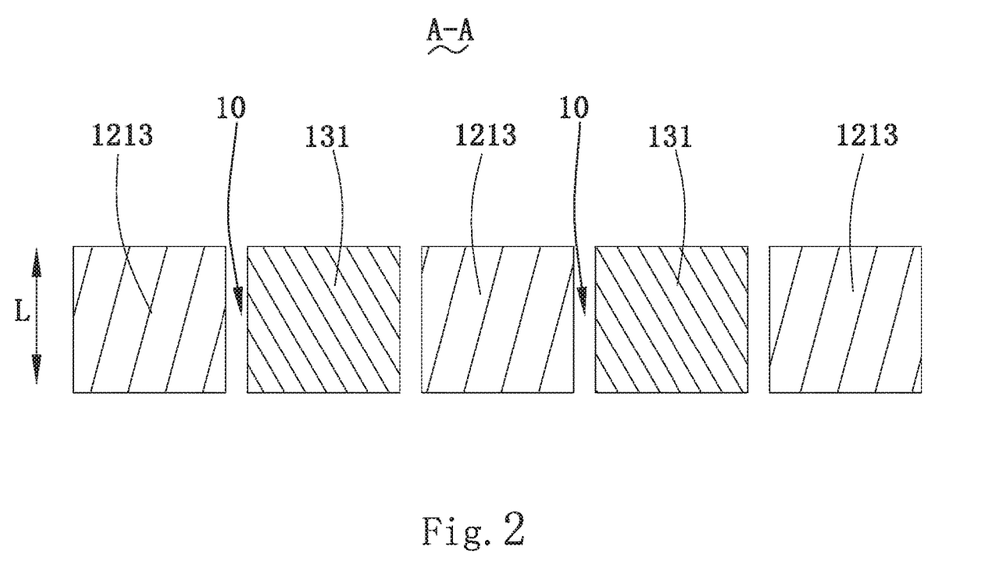
FIG. 2 is a schematically cross-sectional view of the MEMS sound transducer shown in FIG. 1 taken along A-A line.
Figure 3:
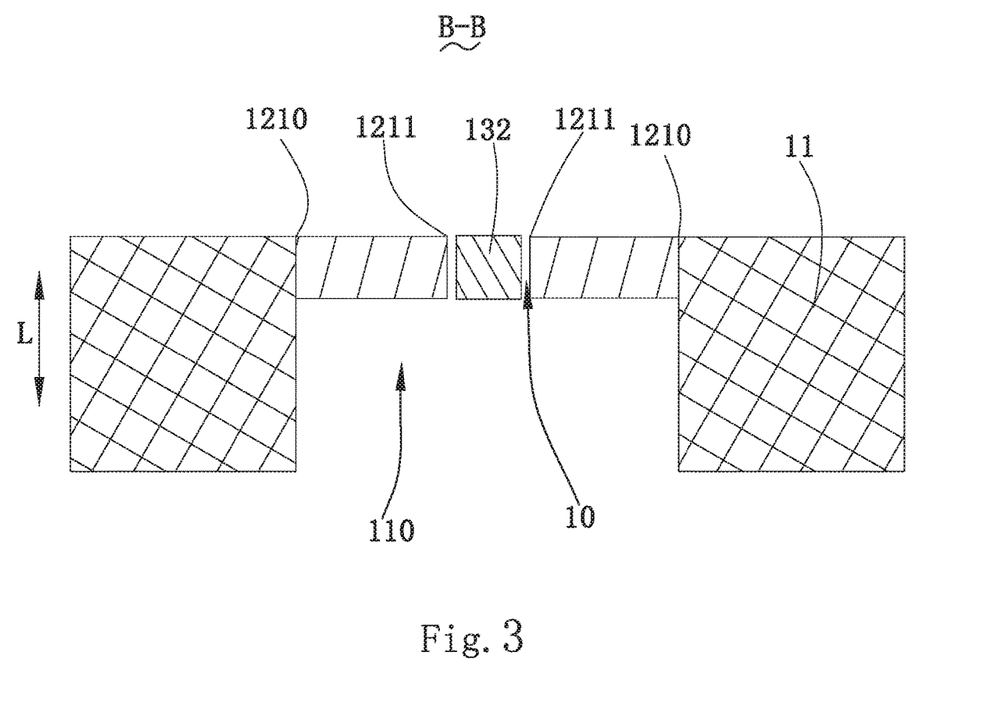
FIG. 3 is a schematically cross-sectional view of the MEMS sound transducer shown in FIG. 1 taken along B-B line.
Figure 4:
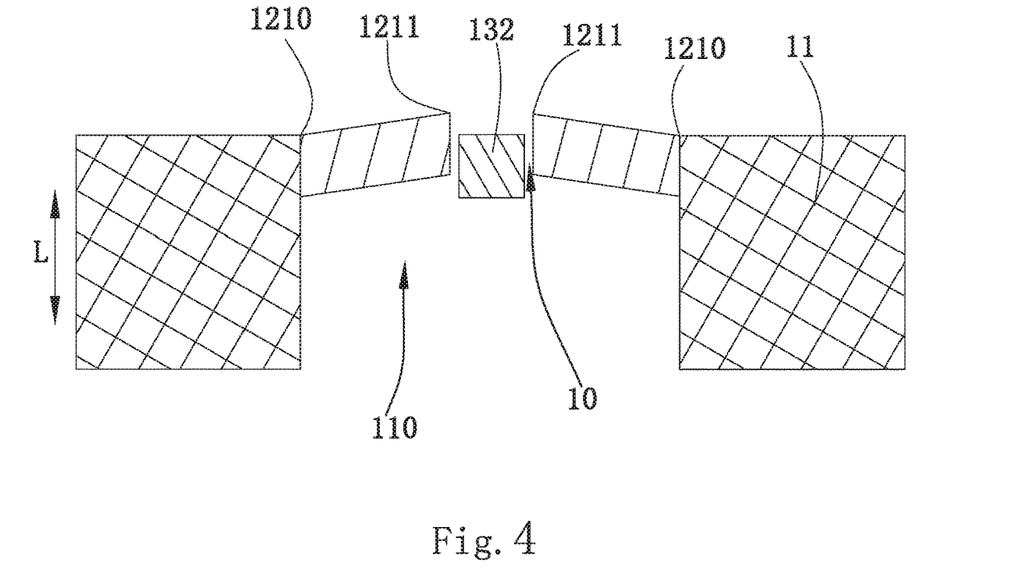
FIG. 4 schematically shows the movable cantilever and comb-fingers of the MEMS sound transducer shown in FIG. 1 vibrating under a sound pressure.

Specifically, the stator 13 has four fixed arms 132. The MEMS sound transducer 100 has four movable cantilevers 121. The four fixed arms 132 may extend toward a length side of the substrate 11 or extends toward a corner of the substrate 11. The movable cantilevers 121 may be disposed at a center of the substrate 11 or located at corners of the substrate 11. When the MEMS sound transducer 100 is subjected to sound pressure waves, either from the top of the movable cantilever or the bottom of the substrate, the movable cantilever vibrate upward and downward.

The movable cantilever 121 may be patterned directly from the substrate material. And the fixed end 1210 may be anchored to the inner side of the substrate 11 and located at the back cavity 110.

The movable cantilever 121 may be made of a single material or combination of materials. The material may be monocrystalline silicon, polycrystalline silicon, silicon oxide, silicon nitride, silicon oxynitride, metals, and so on. Alternatively, the movable cantilever 121 may be made by stacked layers. The stacked layers may be made of the same material, or made of different materials.

Embodiment 2

Figure 5:
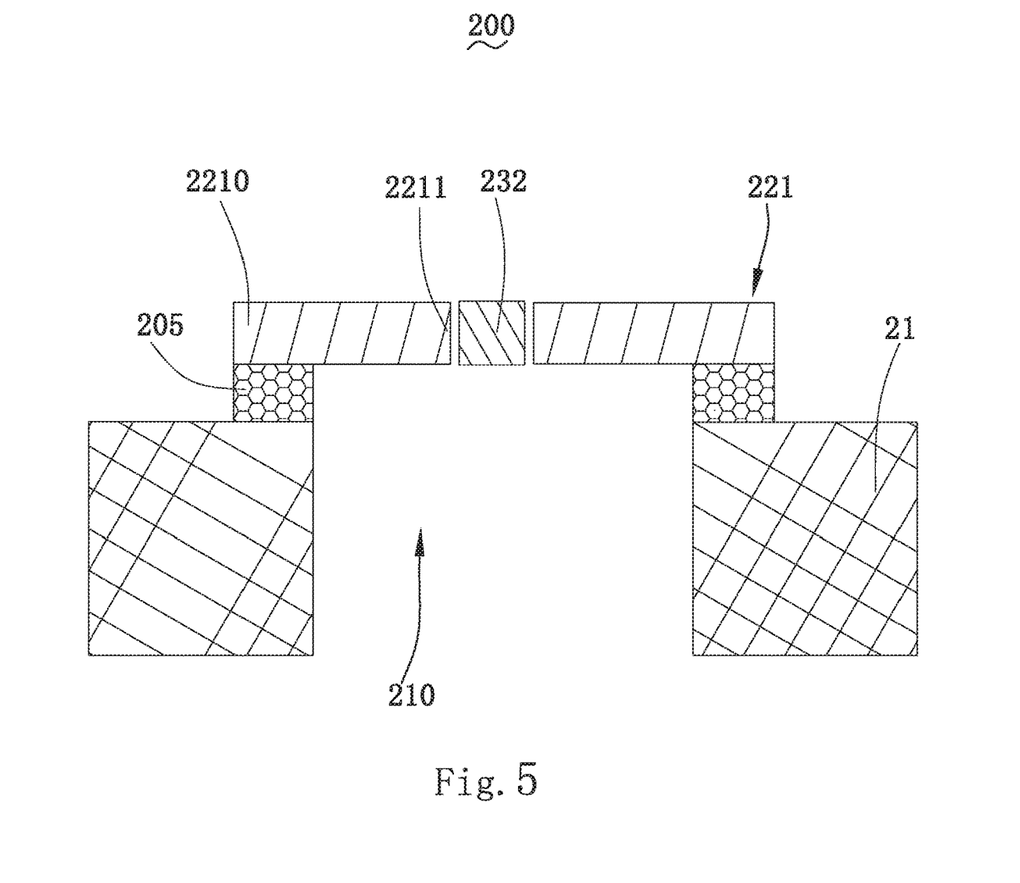
FIG. 5 is a schematically cut-away view of a MEMS sound transducer according to a second embodiment of the present disclosure.
Figure 6A:
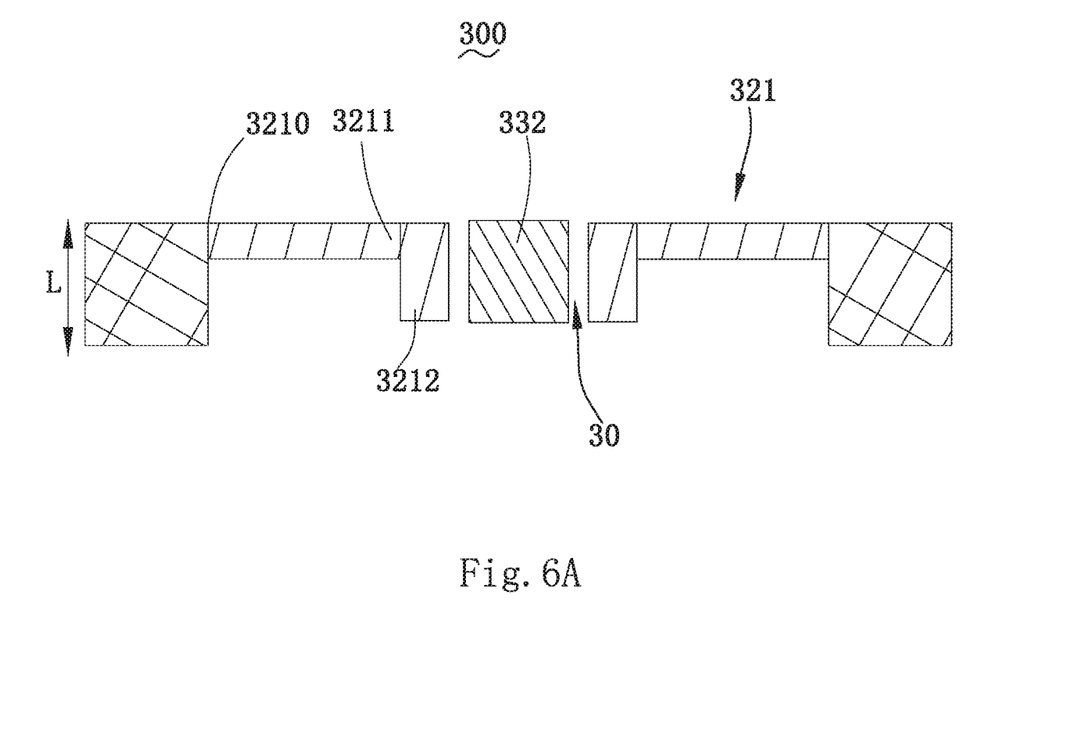
FIG. 6A through FIG. 6D are schematically cut-away views of a MEMS sound transducer according to a third embodiment of the present disclosure.
Figure 6B:
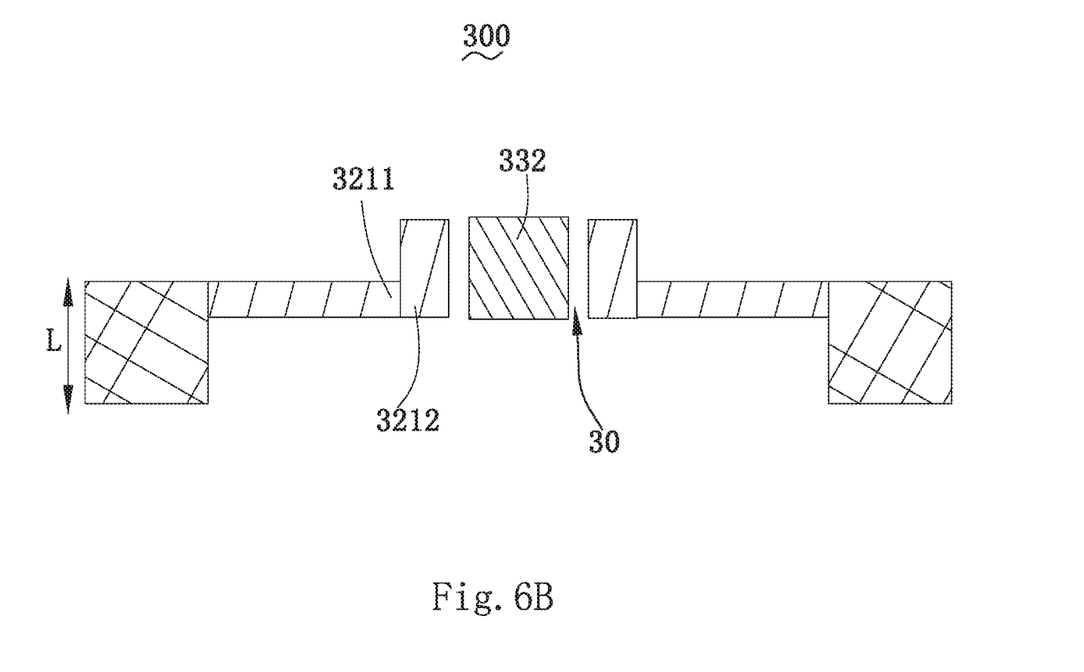
Figure 6C:
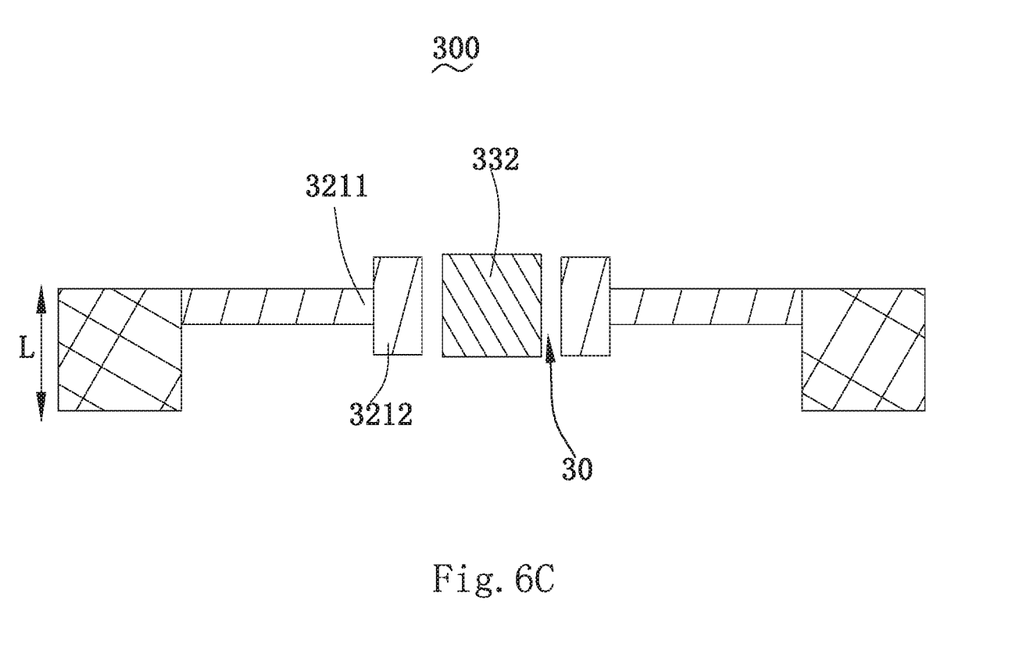
Figure 6D:
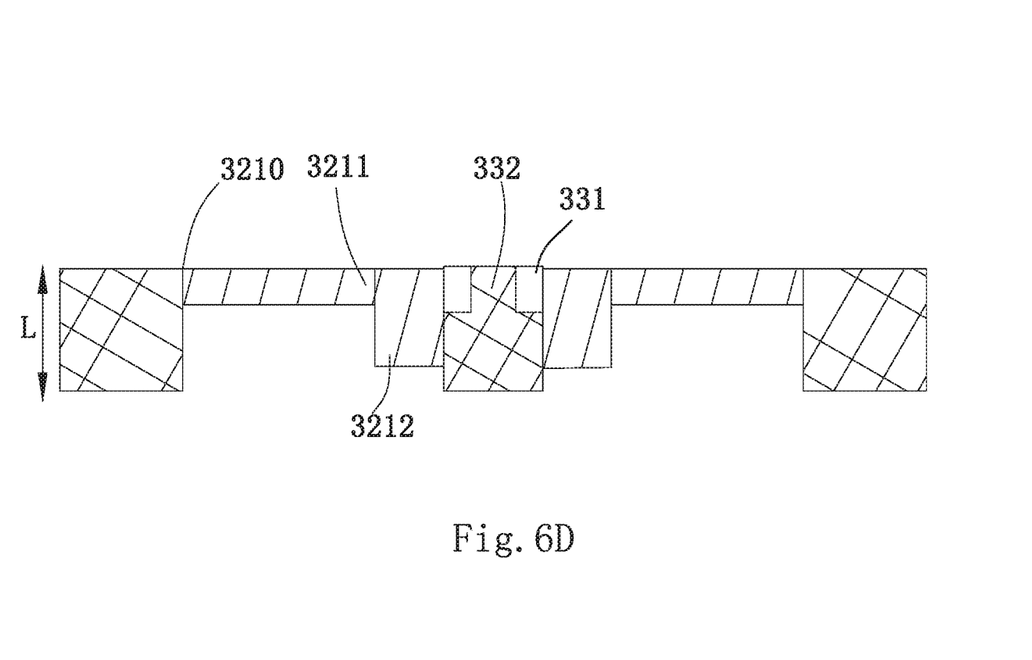

In this embodiment, as shown in FIG. 5, most of the elements of the MEMS sound transducer 200 are the same as that in EMBODIMENT 1. Only one difference presented in EMBODIMENT 2 is detailed as follows. The MEMS sound transducer 200 further includes a spacer 205. The movable cantilever 221 may be made as an independent element and has a fixed end 2210 fixed to the spacer 205 via bonding, etc. The spacer 205 is mounted on the substrate 21. The movable cantilever 221 has a free edge 2211 facing the fixed arms 232 with space and extending to the back cavity 210.

Embodiment 3

In this embodiment, as shown in FIG. 6A-6D, most of the elements of the MEMS sound transducer 300 are the same as that in EMBODIMENT 1. The differences presented in EMBODIMENT 3 are detailed as follows. In this embodiment, the height of the movable cantilever 321 is lower than that of the fixed arm 332. In order to increase the overlap area 30, each of the movable cantilevers 321 further includes a protruding part 3212. The protruding part 3212 extends from the free edge 3211 downward or upward in the vibrating direction L of the movable cantilever 321 to increase the overlap area 30. Preferably, a height of the protruding part 3212 may be equal to that of the fixed arm 332. In other embodiments, the height of the protruding part 3212 in the vibrating direction L may be different from that of the fixed arm 332 in the vibrating direction L. In this embodiment, the stator comb-fingers 331 may be disposed inside the fixed arm 331.

Embodiment 4

Figure 7A:
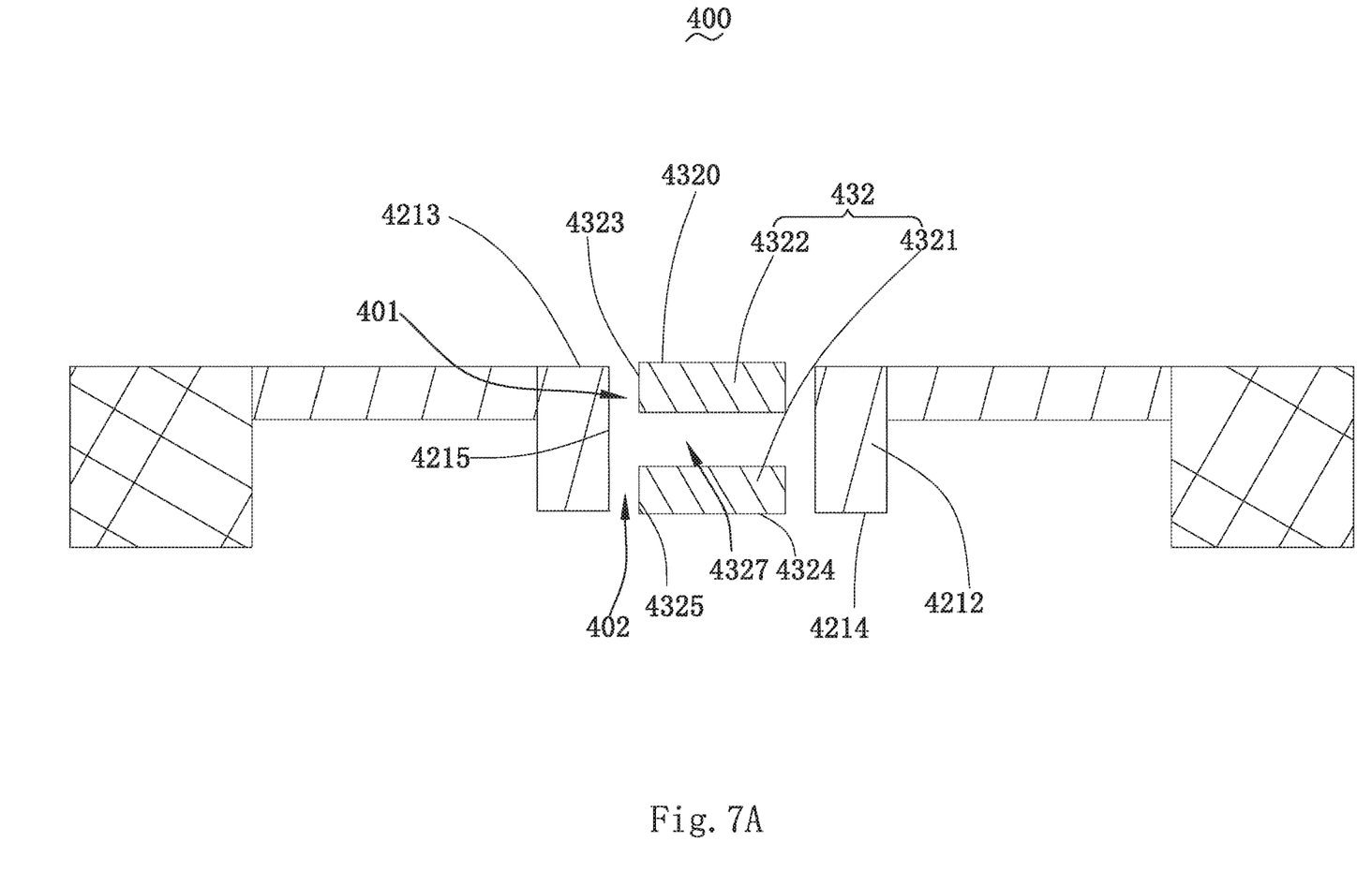
FIG. 7A and FIG. 7B are schematically cut-away views of a MEMS sound transducer according to a fourth embodiment of the present disclosure.
Figure 7B:
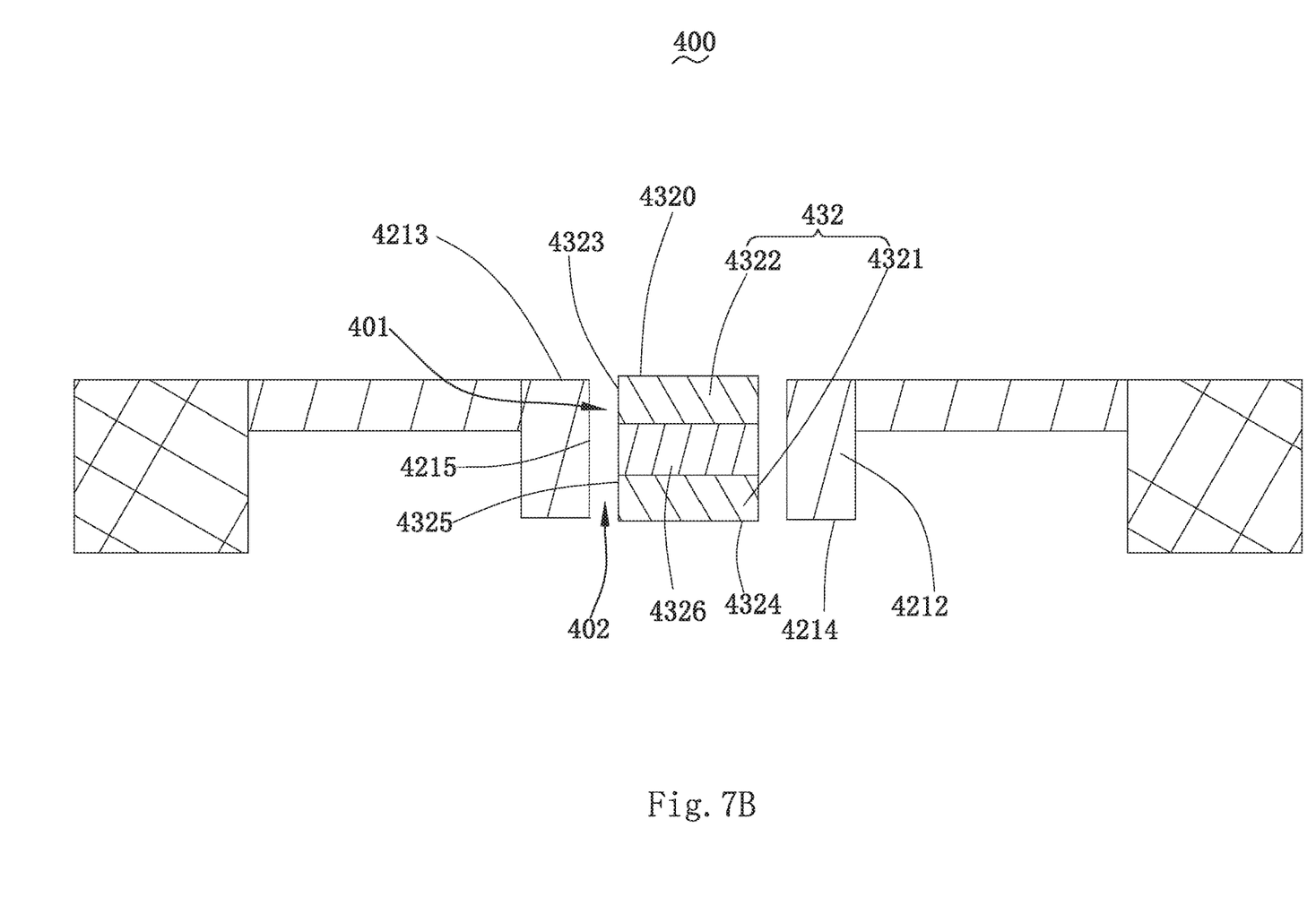

In this embodiment, as shown in FIG. 7A-7B, most of the elements of the MEMS sound transducer 400 are the same as that in EMBODIMENT 3. The differences presented in EMBODIMENT 4 are detailed as follows. In this embodiment, the fixed arm 432 is divided into a bottom layer 4321 and a top layer 4322. The bottom layer 4321 and the top layer 4322 are electrically isolated. The fixed arm 432 may be divided by an insulator layer 4326 or an air gap 4327. A top surface 4320 of the top layer 4322 and a top surface 4213 of the protruding part 4212 are on the same horizontal plane. A bottom surface 4324 of the bottom layer 4321 and a bottom surface 4214 of the protruding part 4212 are on the same horizontal plane. A part of the side surface 4215 of the protruding part 4212 faces a side surface 4323 of the top layer 4322 to form an upper overlap area 401 and a part of the side surface 4215 of the protruding part 4212 faces a side surface 4325 of the bottom layer 4321 to form a lower overlap area 402. With such configuration, the MEMS sound transducer may be a differential sound transducer. The movable cantilever is configured to be placed at rest position so that the overlap area do not cover the whole surface area of either the top layer or the bottom layer. The control of the position can be realized by controlling and optimizing the stress in the stack of materials constituting the movable cantilever. Such position is preferred in order to allow the overlap sensing area to either increase or decrease during the vibration of the movable cantilever. If so, for example, if subjected to a sound pressure wave, the movable cantilever is displaced upward, the overlap area between the top layer and the cantilever is increased and the capacitance is increased; while at the same time the overlap area between the bottom layer and the cantilever is decreased and the capacitance is decreased, vice versa. Following such behavior, comparing the 2 signal changes (a capacitance increasing and a capacitance decreasing with regard to a common reference signal), one is then able to obtain a differential output which increases the signal-to-noise ratio.

Embodiment 5

Figure 8A:
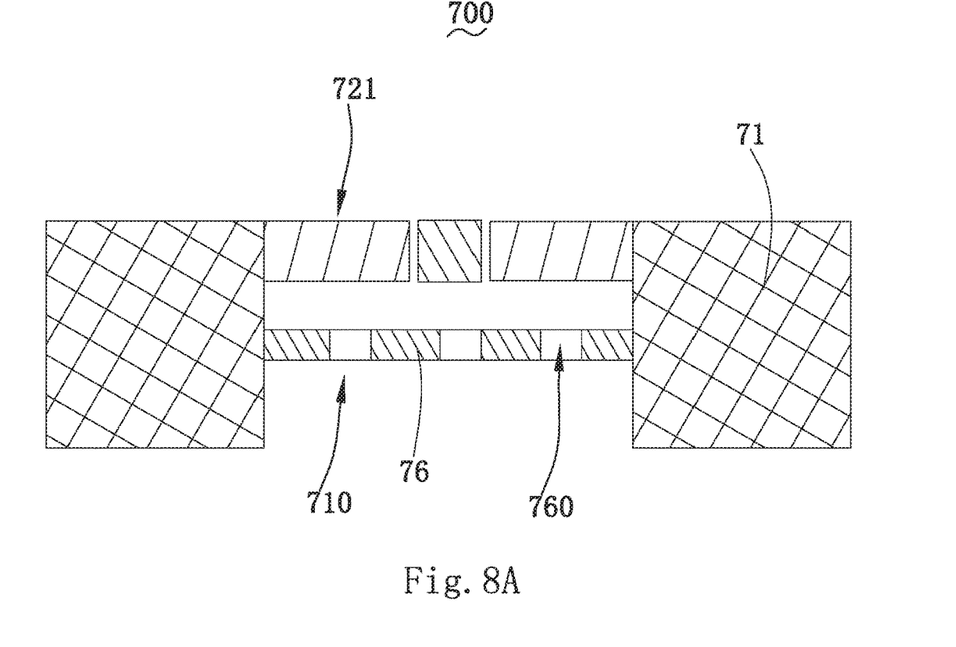
FIG. 8A and FIG. 8B are schematically cut-away views of a MEMS sound transducer according to a fifth embodiment of the present disclosure.
Figure 8B:
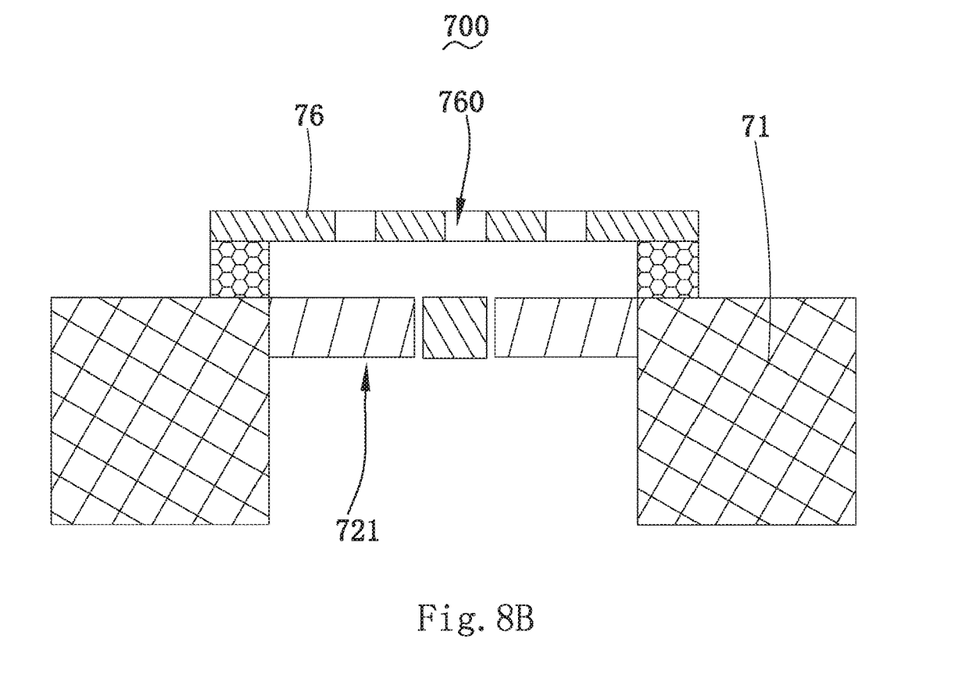

In this embodiment, as shown in FIG. 8A-FIG. 8B, Embodiment 5 has the same structure as that of the Embodiment 1. The difference between Embodiment 1 and Embodiment 5 is listed as following: the EMES sound transducer 700 in embodiment 5 further includes a back plate 76. The back plate 76 and the movable cantilever 721 are spaced from each other in the vibrating direction L. The back plate 76 and the movable cantilever 721 construct a capacitive couple. The back plate 76 has a multiple through holes 760 formed therein. With such configuration, the position of the cantilever can be controlled so that the edge of the movable cantilever and the edge of the stator are disposed in the best position for signal purpose.

As shown in FIG. 8A, the back plate 76 is fixed to the substrate 71 and received in the back cavity 710.

Alternatively, as shown in FIG. 8B, the back plate 76 is mounted on the substrate 71 via a supporting member 77. The back plate 76 is disposed above the movable cantilever 721.

Embodiment 6

Figure 9:
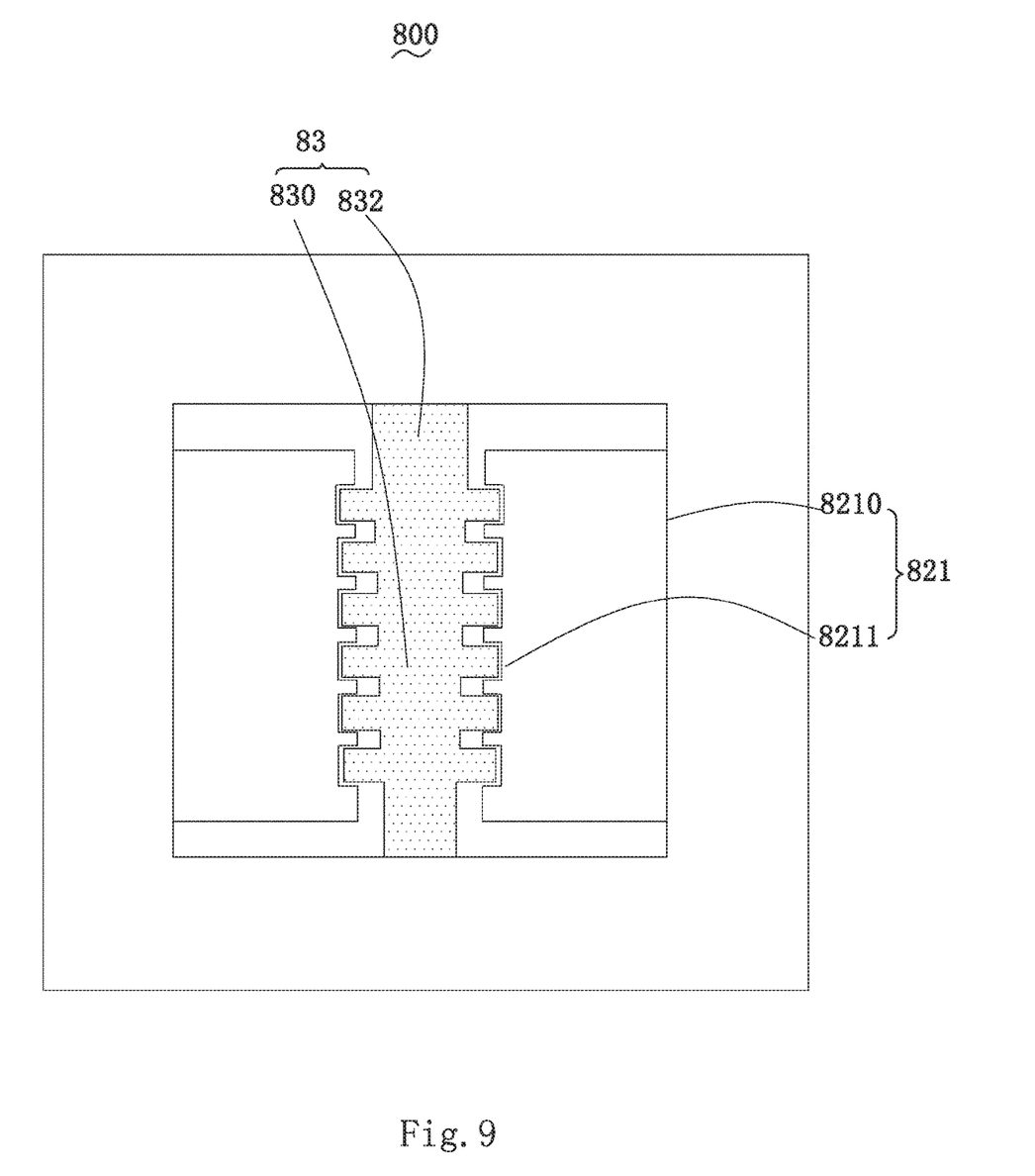
FIG. 9 is a schematically top view of a MEMS sound transducer according to a sixth embodiment of the present disclosure.

In this embodiment, as shown in FIG. 9, Embodiment 6 has the same structure as that of the Embodiment 1. The difference between Embodiment 1 and Embodiment 6 is listed as following. In Embodiment 6, the stator 83 has two fixed arms 832 extended from the center portion 830 in opposite directions. The two fixed arms 832 and the center portion 830 constructed a straight line. The MEMS sound transducer 800 has two movable cantilevers 821 are disposed at both sides of the stator 830 and symmetrically about the stator 830.

Embodiment 7

Figure 10:
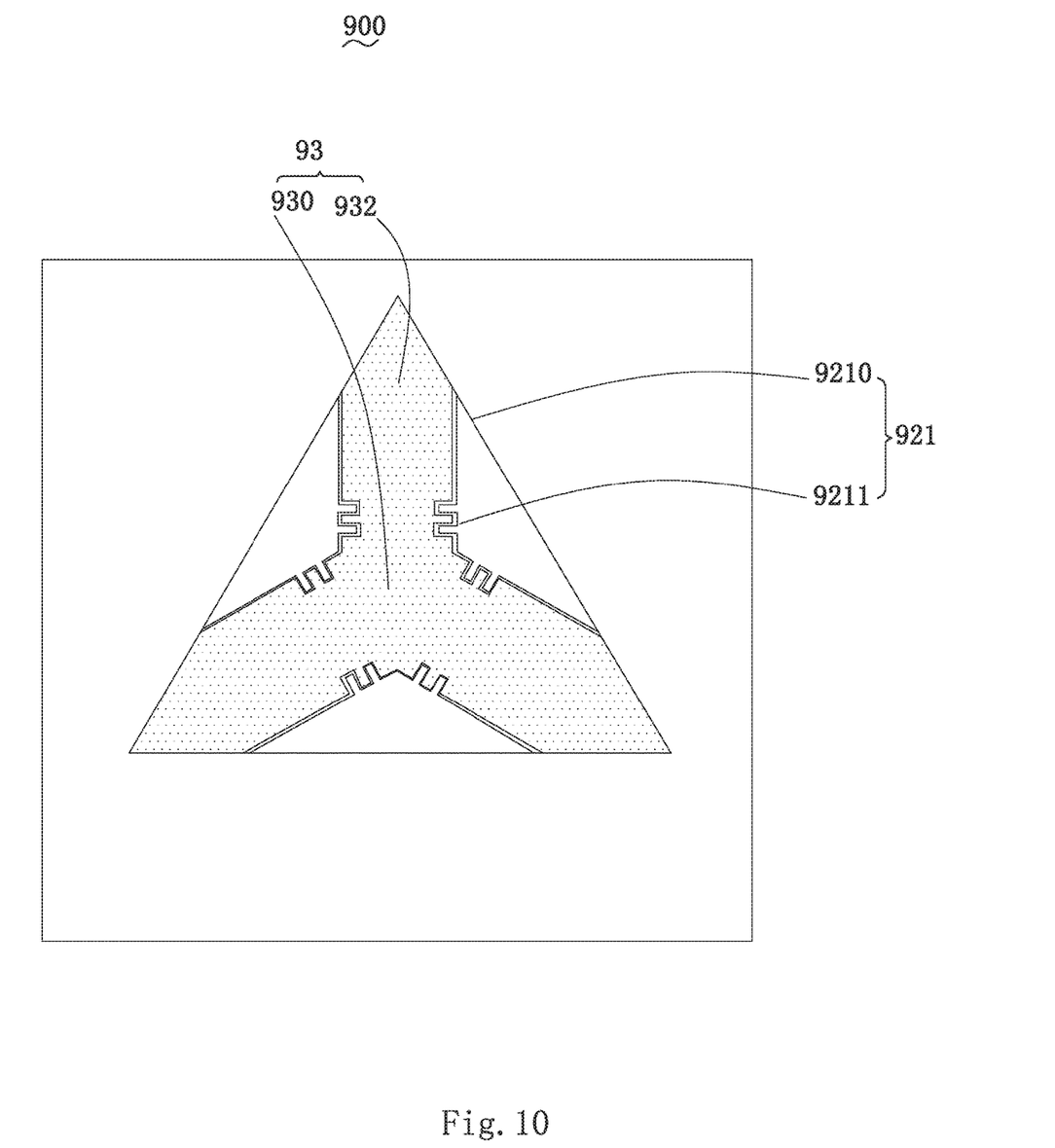
FIG. 10 is a schematically top view of a MEMS sound transducer according to a seventh embodiment of the present disclosure.

In this embodiment, as shown in FIG. 10, Embodiment 7 has the same structure as that of the Embodiment 7. The difference between Embodiment 1 and Embodiment 7 is listed as following. In Embodiment 7, the stator 93 has three fixed arms 932 extended from the center portion 930 in different directions. The MEMS sound transducer 900 has three movable cantilevers 921.

The above is only the embodiment of the present invention, but not limit to the patent scope of the present disclosure, and the equivalent structures or equivalent process transformations made by utilizing the present disclosure and the contents of the drawings, or directly or indirectly applied to other related technology fields, are all included in the scope of the patent protection of the present disclosure.

What is claimed is:
1. A MEMS sound transducer, comprising:
a substrate having a back cavity;
a stator, the stator having a central portion suspending on the back cavity and at least two fixed arms extending from the center portion to the substrate and fixed on the substrate;
a movable cantilever, mounted to the substrate, at least partially facing the back cavity and disposed between two adjacent fixed arms; wherein, the movable cantilever has a fixed end mounted to the substrate and a free edge facing the fixed arms with space;

the free edge has a plurality of moving comb-fingers formed thereon;

the stator has a plurality of fixed comb-fingers formed on the fixed arms;

the moving comb-fingers and the fixed comb-fingers fit to each other to form a capacitor with an overlap area;

further comprising a back plate mounted on the substrate, the back plate spaced from the movable cantilever and formed a capacitive coupling with the movable cantilever; the back plate further comprising a plurality of through holes.

2. The MEMS sound transducer according to claim 1, wherein, the stator has four fixed arms; and the MEMS sound transducer further has four movable cantilevers.

3. The MEMS sound transducer according to claim 1, further comprising a spacer, the spacer is fixed to the substrate, and the fixed end of the cantilever is mounted on the substrate via the spacer.

4. The MEMS sound transducer according to claim 1, wherein, a height of the cantilever along a vibrating direction is equal to that of the fixed arm.

5. The MEMS sound transducer according to claim 1, wherein, a height of the cantilever is lower than that of the stator along a vibrating direction, the cantilever further comprises a protruding part extending from the free edge upward or downward in a vibrating direction; the height of the protruding part is equal to that of the fixed arm.

6. The MEMS sound transducer according to claim 1, wherein, a height of the cantilever is lower than that of the stator along a vibrating direction, the cantilever further comprises a protruding part attached to the free edge at a center thereof; the height of the protruding part is equal to that of the stator.

7. The MEMS sound transducer according to claim 1, wherein, the fixed arm has a top layer and a bottom layer, the top layer and the bottom layer are spaced from each other and electrically isolated from each other.

8. The MEMS sound transducer according to claim 7, wherein, the stator further includes an insulation layer formed between the top layer and the bottom layer.

9. The MEMS sound transducer according to claim 7, wherein, an air gap is formed between the top layer and the bottom layer.

* * * * *